United States Patent [19]
Tozawa et al.

[11] Patent Number: 5,506,512
[45] Date of Patent: Apr. 9, 1996

[54] TRANSFER APPARATUS HAVING AN ELEVATOR AND PROBER USING THE SAME

[75] Inventors: Noboru Tozawa, Nirasaki; Hisashi Nakajima, Yamanashi; Kazuhito Yokomori, Nirasaki, all of Japan

[73] Assignees: Tokyo Electron Limited, Tokyo; Tokyo Electron Yamanashi Limited, Nirasaki, both of Japan

[21] Appl. No.: 347,136

[22] Filed: Nov. 23, 1994

[30] Foreign Application Priority Data

| Nov. 25, 1993 | [JP] | Japan | 5-318947 |
| Nov. 25, 1993 | [JP] | Japan | 5-318948 |
| Sep. 2, 1994 | [JP] | Japan | 6-234115 |

[51] Int. Cl.[6] .................................................. G01R 31/22
[52] U.S. Cl. ................................. 324/754; 324/765
[58] Field of Search ............................ 324/754, 158.1, 324/73.1, 765, 725; 414/225, 226, 416; 198/394; 187/351, 352, 254

[56] References Cited

U.S. PATENT DOCUMENTS

| 4,095,681 | 6/1978 | David | 187/352 |
| 4,103,232 | 7/1978 | Sugita et al. | 198/394 |
| 4,548,298 | 10/1985 | Bom | 187/315 |
| 4,775,281 | 10/1988 | Prentakis | 414/416 |
| 5,202,539 | 4/1993 | Lamb | 187/254 |

*Primary Examiner*—Vinh P. Nguyen
*Attorney, Agent, or Firm*—Oblon, Spivak, McClelland, Maier & Neustadt

[57] ABSTRACT

A prober for a semiconductor wafer includes a main body having an interface section connected to probe needles, a test head detachably attached to the interface section, and a manipulator for moving the test head. The manipulator includes X-, Y-, Z-, θX-, θY-, and θZ-positioning mechanisms for positioning the test head in six directions. The Z-positioning mechanism consists of an elevator which is installed on a base and drives a slide frame. A fall preventing mechanism is provided adjacent to the elevator. The fall preventing mechanism includes a nut of a ball thread provided on the slide frame, and a shaft of the ball thread which is engaged with the nut. A brake shoe is provided at the lower end of the shaft. A brake seat is provided on the base and faces the lower surface of the brake shoe. A ball pushed by a spring is in point-contact with the center of the lower surface of the brake shoe, so that a small gap is formed between the brake shoe and the brake seat. When a thrust load exceeding a bias force of the spring is applied to the shaft by the test head due to a breakdown of the elevator, the shaft moves down together with the slide frame by the small gap. Accordingly, the brake shoe is brought into contact with the brake seat, thereby preventing the shaft from rotating relative to the nut, so that the slide frame is prevented from moving down any more.

20 Claims, 10 Drawing Sheets

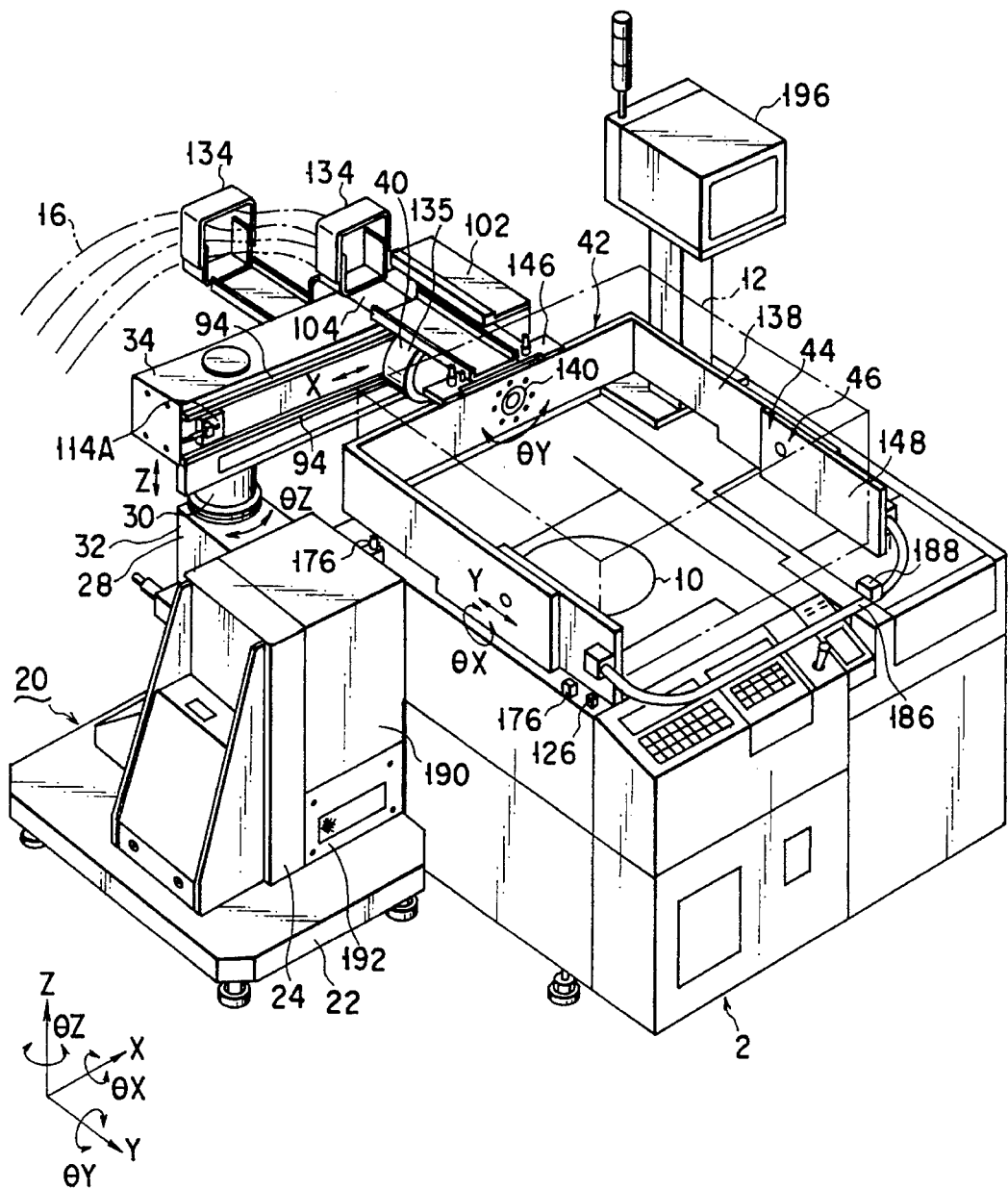
F I G. 1

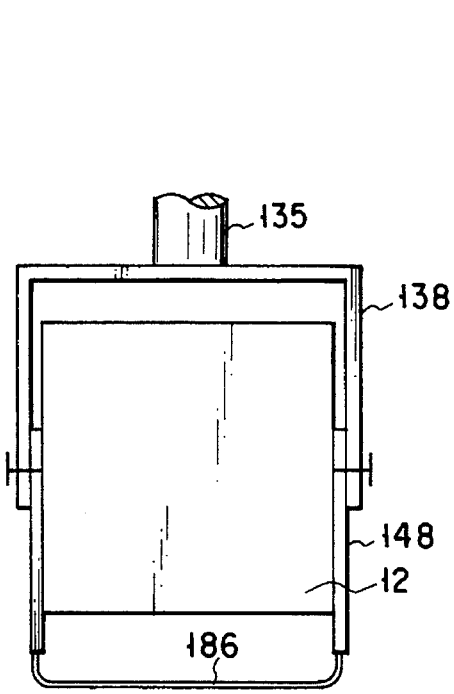
F I G. 5
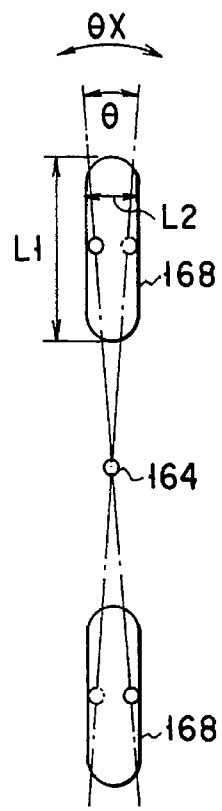
F I G. 6
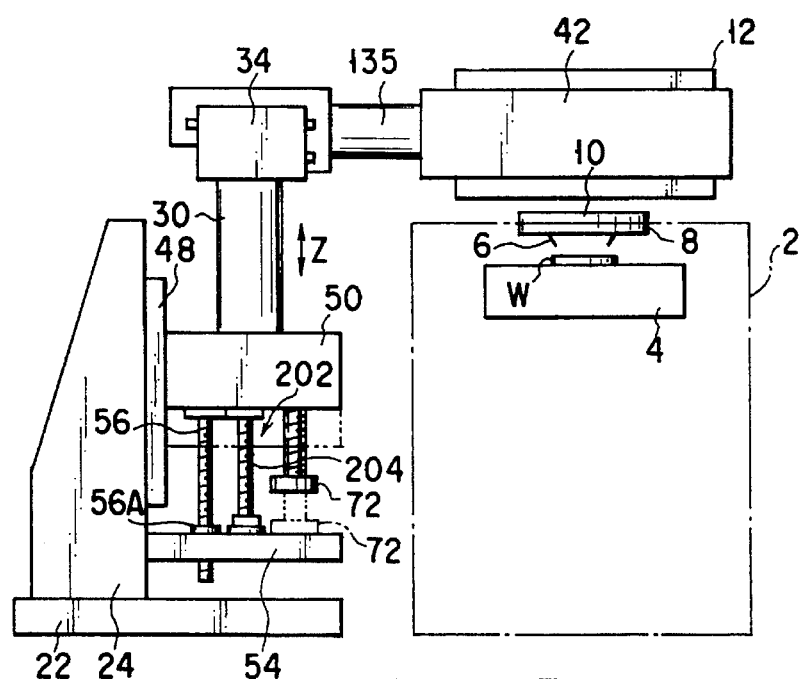
F I G. 7

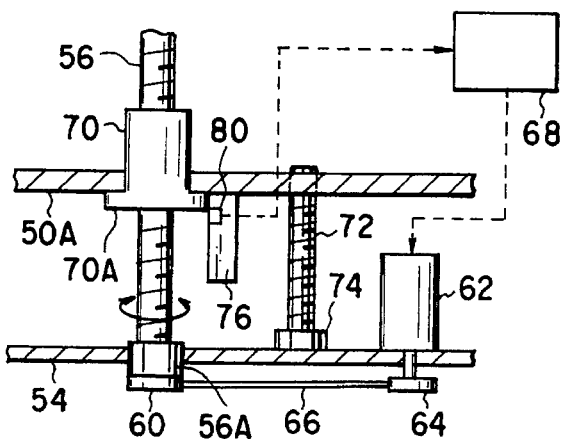
FIG. 8A
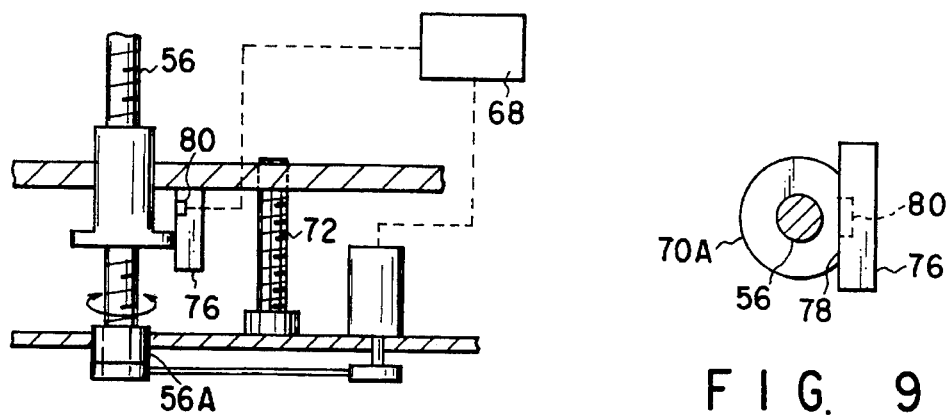
FIG. 8B
FIG. 9
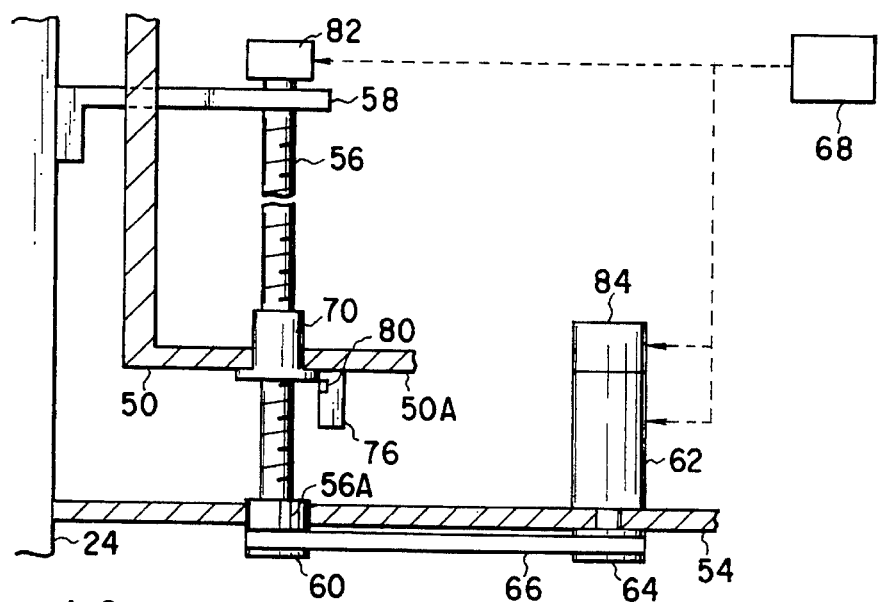
FIG. 10

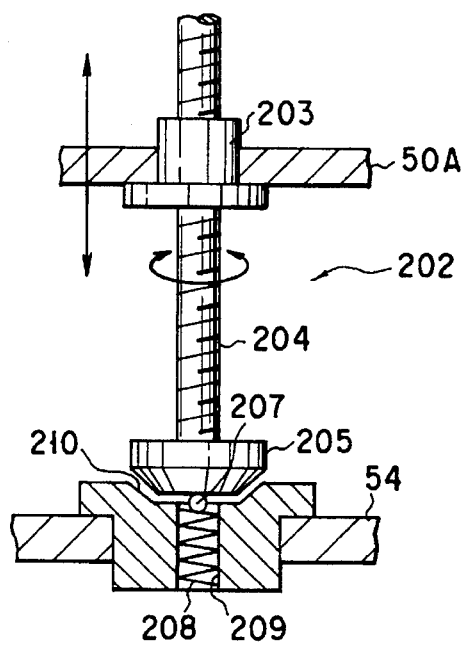
F I G. 17

TRANSFER APPARATUS HAVING AN ELEVATOR AND PROBER USING THE SAME

BACKGROUND OF THE INVENTION

1. Field of the Invention

The present invention relates to a transfer apparatus which is used for moving a heavy load at least in upward and downward directions, i.e., for elevating the heavy load and which has a fall preventing mechanism, and also relates to a prober which incorpolates the transfer apparatus as means for moving a test head.

2. Description of the Related Art

A prober is used to test electric characteristics of semiconductor devices (or semiconductor chips) formed on a semiconductor wafer, an LCD substrate, or the like. An example of a conventional prober is shown in FIGS. 18 and 19. The main body 2 of the prober is provided with a work table 4 which is movable in the X- and Y-directions in a horizontal plane and in a Z-direction which is a vertical direction. An object to be probed, for example, a semiconductor wafer W is mounted on the upper surface of the work table. A ring-like probe card 8 provided with a plurality of probe needles 6, and an interface section 10 having a contact with the upper surface of the card and electrically connected with the probe card 8 are detachably secured to the upper surface of the main body 2.

A test head 12 is rotatably supported at a side portion of the main body 2 and can stand or lie on the upper surface of the main body 2. A contact ring 14 for making electric contacts with a number of polygonal pins provided in the interface section 10. Wiring bundle 16 consisting of a number of wirings extending from the test head 12 is connected to a tester 18 with which electric characteristics of an object are tested.

When the position of electrode pads is changed on an object, the probe card 8, the contact ring 14, and the like must be exchanged so as to comply with the changed position. In this state, the test head 12 which has a weight up to about 300 kg is manually rotated to stand, thereby to perform exchange services. In addition, the test head 12 must be rotated in the same manner when the contact ring 14 and the probe card 8 are subjected to maintenance services.

In these cases, the operational efficiency and the security are not excellent since this test head 12 is manually operated so as to stand or lie by an operator, as has been explained above.

SUMMARY OF THE INVENTION

The present invention has as its object to provide a transfer apparatus which is capable of efficiently and safely moving a heavy load such as a test head of a prober and which has a fall preventing mechanism, and to provide a prober incorporating the transfer apparatus.

According to a first aspect of the present invention, there is provided a transfer apparatus for moving up and down a heavy load, comprising: a support for supporting the heavy load; an elevator for moving up and down the support, with the heavy load being supported thereon; a base mounting the elevator; a nut of a ball thread, attached to the support, the ball thread having a center axis oriented in a substantially vertical direction; a shaft of the ball thread to be engaged with the nut; a brake shoe provided at a lower end portion of the shaft; a brake seat provided on the base so as to face a lower surface of the brake shoe; a thrust bearing for substantially rotatably supporting the shaft; and a spring for supplying the thrust bearing with a bias force against the shaft, such that a small gap is formed between the brake shoe and the brake seat, wherein when a thrust load exceeding the bias force of the spring is applied to the shaft by the heavy load due to a breakdown of the elevator, the shaft moves down together with the support by a distance corresponding to the small gap and the brake shoe and the brake seat are therefore brought into contact with each other, thereby preventing rotation of the shaft relative to the nut, so that the support is prevented from moving down any more.

According to a second aspect of the present invention, there is provide a prober for testing electric characteristics of a test object, comprising: a work table for mounting the test object; a plurality of probe needles provided above the work table; an interface section electrically connected to the probe needles; a casing for supporting the interface section; and a test head which can be electrically connected to the interface section and is detachable therefrom.

The transfer apparatus according to the first aspect is used to move the test head, relative to the interface section.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a perspective view showing a prober for a semiconductor wafer according to the present invention;

FIG. 5 is a plan view showing a state in which the test head is installed on the frame;

FIG. 6 is an illustration for explaining positioning in the Y and θX directions when the test head is installed on the frame;

FIG. 7 is a side view showing the manipulator of the prober shown in FIG. 1;

FIGS. 8A and 8B are diagrams for explaining a relation between a Z-positioning mechanism or elevator and a lowering stopper;

FIG. 9 is a bottom view showing a relation between the Z-positioning mechanism and a rotation stopper of a sleeve;

FIG. 10 is an illustration for explaining brake means provided at the Z-positioning mechanism or elevator;

FIG. 17 is a side view showing a fall preventing mechanism;

DETAILED DESCRIPTION OF THE PREFERRED EMBODIMENT

As shown in FIG. 1, a prober for a semiconductor wafer according to the present invention mainly comprises a substantially rectangular main body 2, a test head 12 provided on the top of the main body, and a manipulator 20 for moving and positioning the test head 12. The test head 12 which is indicated by a continuous line is indicated by a dashed line in FIG. 1 in order to clarify the structure of the manipulator 20.

Figure 19:
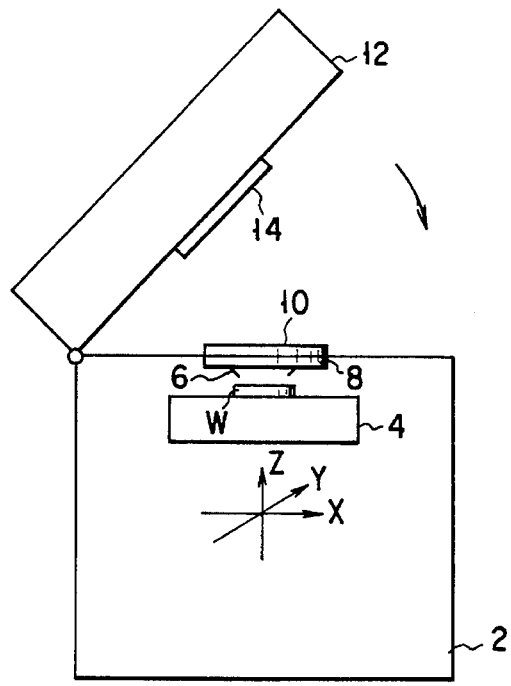
FIG. 19 is a schematic side view showing the prober of FIG. 18.
Figure 18:
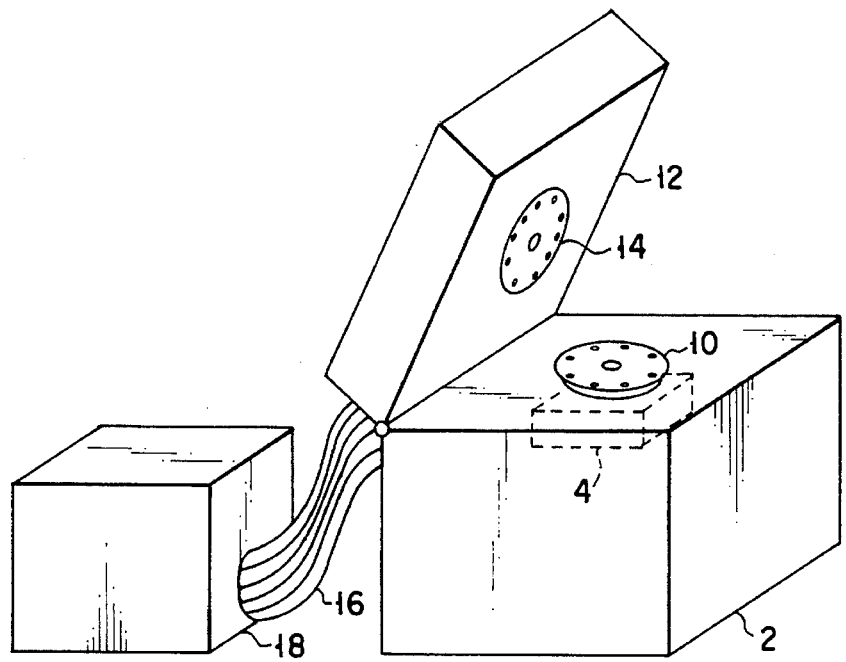
FIG. 18 is a schematic perspective view showing a conventional prober.

The internal structures of the main body 2 and the test head 12 are constructed in the same manner as in a conventional device shown in FIGS. 18 and 19. As shown in FIG. 7, the main body 2 is provided with a work table 4 which moves with a semiconductor wafer as an object mounted thereon, with a probe card 8 having a number of probe needles 6, and a probe card interface section 10 for forming an electric connection between the prove needle 6 and the test head 12. A contact ring 14 is provided on the lower surface of a test head 12, and is detachably connected to the interface section 10.

Since various test circuits are closely contained in the test head 12, the head weights about 300 kg at most, so that the manipulator 20 which controls movements of the test head 12 requires high rigidity. A wiring bundle 16 consisting of a number of wirings connected to a tester 18 extends toward behind the test head 12 (see FIG. 16A). Since the contact ring 14 of the test head 12 must be accurately positioned to have a contact with the interface section 10, the manipulator 20 must have a function of positioning the test head in respective axial directions.

In this embodiment, positioning mechanisms are provided such that the manipulator 20 achieves positioning in six axial directions. These six directions are X- and Y-directions extending at right angles to each other in a horizontal plane, a Z-direction extending at right angles to the horizontal plane, and rotational directions θX, θY, and θZ in which rotation is respectively achieved in the planes extending at right angles to the above three axial X-, Y-, and Z-directions.

Figure 2:
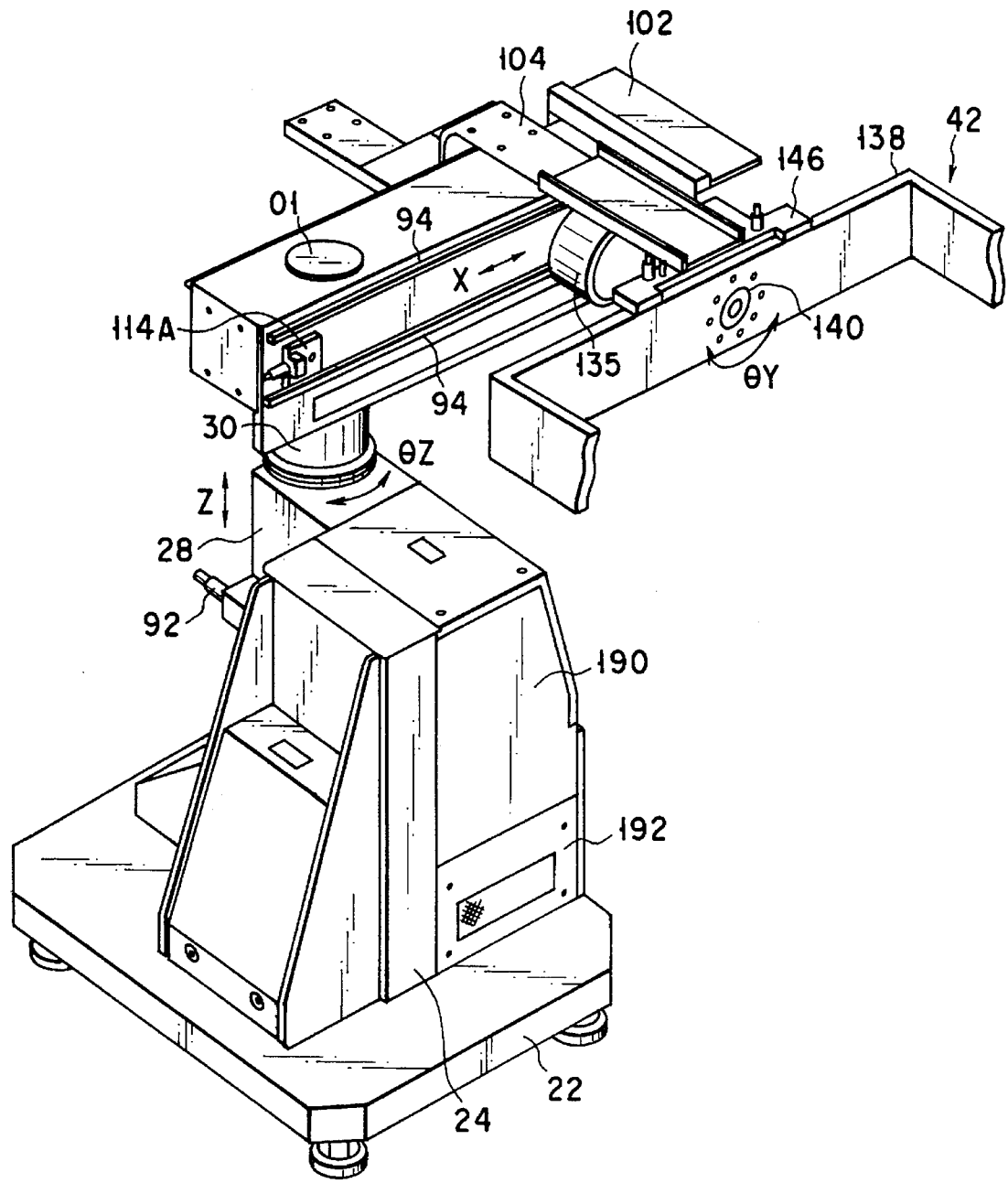
FIG. 2 is a perspective view showing a manipulator of the prober shown in FIG. 1.
Figure 3:
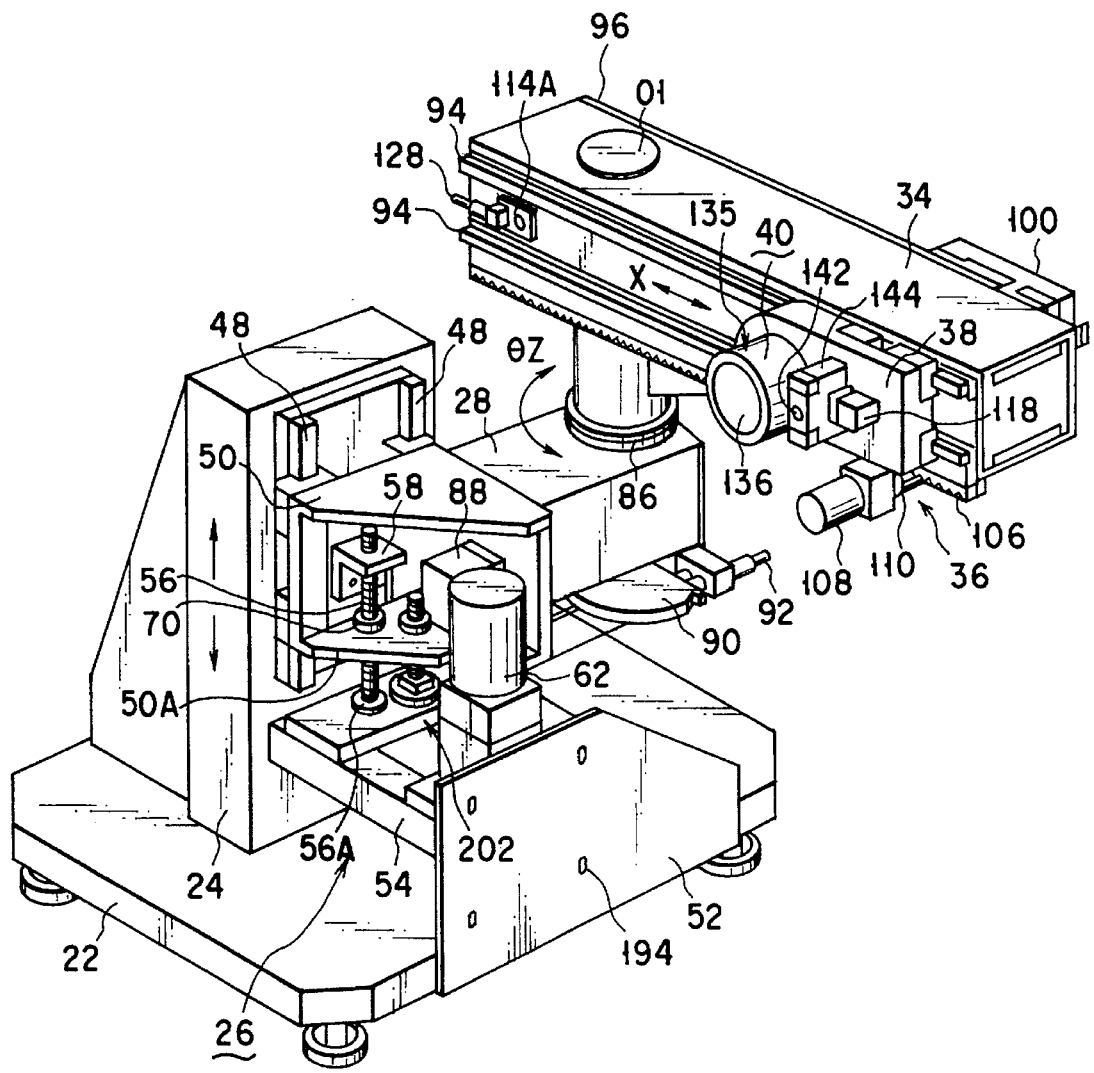
FIG. 3 is a perspective view showing the manipulator of FIG. 2 at another angle.

As shown in FIGS. 1 to 3, a horizontal support 28 is provided on a fixed support 24 standing on the base 22 of the manipulator 20, by means of a Z-positioning mechanism such that the horizontal support 28 can be elevated up and down. A rotation support 30 is provided at and stands on the top end of the horizontal support 28, by means of a θZ-positioning mechanism 32 such that the rotation support 30 is rotatable in the θZ-direction around the Z-direction. A horizontal arm 34 is fixed to the top end of the rotation support 30 and further, a slide block 38 is slidably provided on the horizontal arm 34 by means of an X-positioning mechanism 36. A frame section 42 is provided at the slide block 38 by means of a Y-positioning mechanism 40. The test head 12 is fixed to the frame section 42 by a Y-positioning mechanism 44 and a θX-positioning mechanism 46 (see FIG. 1 and FIG. 4).

In this embodiment, as explained above, the positions of the test head 12 in the Y- and X-directions are adjusted when the test head 12 is fixed to the frame section 42, and these positions are secured thereafter. However, the test head 12 is movable in the other four axial directions, and is moved in those directions if necessary. In this respect, the prober may be designed such that the position of the test head 12 in arbitrary one or ones of the axial directions is secured and the position thereof is movable in any other one or ones of the axial directions.

At first, the Z-positioning mechanism 26 will be explained with reference to FIGS. 3, and 7 to 9. A pair of Z-direction guide rails extending in the vertical direction are provided on the side of the standing fixed support 24. A slide frame 50 is slidably installed on the guide rails 48. A base end portion of the horizontal support 28 is fixed to the support or slide frame 50.

Below the slide frame 50, a horizontal frame or base 54 is bridged between the support 24 and a side plate 52 provided at a position opposite to the support 24. A threaded shaft 56 of a ball thread is provided between the horizontal frame 54 and a bottom plate 50A of the slide frame 50, such that the threaded shaft extends through the bottom plate 50A in the vertical direction. A lower end portion of the shaft 56 is rotatably supported at the horizontal frame 54 by means of the bearing 56A, while an upper end portion thereof is rotatably supported by the angle 58 fixed to the support 24.

A fall preventing mechanism 202 is provided between the horizontal frame 54 and the slide frame 50. The fall preventing mechanism 202 will be specifically explained later.

A belt 66 is bridged between a pulley 60 provided at the lower end of the shaft 56 and a pulley 64 of a bi-directional motor 62 which serves as a drive source provided on the horizontal frame or base 54 for the Z-direction. In the illustrated embodiment, an elevator is provided for movement in the Z direction, with the elevator including, e.g., the motor 62, the shaft 56, and the nut or bearing sleeve 70. The shaft 56 is rotated in the positive or negative direction by the motor 62 in accordance with an order from a control section 68. A bearing sleeve 70 of the ball thread which is coupled and engaged with the shaft 56 is installed on the bottom plate 50A of the slide frame 50. The sleeve 70 is installed in a hole formed in the bottom plate 50A, such that the sleeve 70 is movable but not rotatable in its axial direction. The sleeve 70 comprises a round flange 70A at its lower end portion, and lifts up the frame bottom plate 50A. As shown in FIG. 9, a linear cut-in portion 78 is formed in the flange 70A and has a contact with a rotation stopper 76 fixed to the lower surface of the bottom plate 50A.

A rod-like fall stopper 72 is fixed to the bottom plate 50A so as to extend in the downward direction. A cushion member 74, for example, made of synthetic rubber or the like is provided at a lower end portion of the stopper 72. The stopper 72 has a contact with the bottom plate 50A thereby to define the lowermost position of the slide frame 50 in the Z-direction. Therefore, the sleeve 70 solely moves within a range below the lowermost position, while it moves together with the frame bottom plate 50A within a range above the lowermost position where the frame bottom plate 50A is not influenced by the stopper 72.

In other words, a movement of the test head 12 in the downward direction is mechanically stopped by the stopper 72. The length of the stopper 72 is set on the basis of the position at which the lower surface of the test head 12 has a substantial contact with the upper surface of the main body 2. Even if the Z-direction motor 62 is slightly rotated due to a force of inertia after a fall of the slide frame 50 is stopped by the stopper 72, only the sleeve 70 falls as shown in FIG. 8B. The sleeve rotation stopper 76 is provided with a sensor 80 which detects a fall of the sleeve 70 when the sleeve 70 falls relative to the bottom plate 50A. When such a relative fall of the sensor 80 is detected by the sensor 80, the control section 68 stops driving the motor 62.

The Z-direction motor 62 and the ball thread shaft 56 are provided with brake means, for example, an electro-magnetic brakes 82 and 84 operated by an electromagnetic force. When a drive energy supplied to the motor 62 stops due to some reasons, for example, power break down, the electro-magnetic brakes 82 and 84 maintains a stopping position, thereby preventing the test head 12 as a heavy load from falling.

In the next, a θZ-positioning mechanism 32 will be explained with reference to FIG. 3. A rotation support 30 is supported at the top end portion of a horizontal support 28 by means of a bearing 86, such that the rotation support 30 is rotatable in the θZ-direction. The rotation support 30 is connected through a crank mechanism or the like (not shown) to an air-cylinder 88 provided in a horizontal support 28, and is rotatable only within an angle of 90° (see FIG. 16C). The rotation support 30 is provided with a lock plate 90 which integrally rotates with the support 30. At a position of the horizontal support 28 corresponding to a stopping position of the plate 90, there is provided a shock-absorber 92 having an elastic member which collides with the plate 90 thereby absorbing the shock of collision.

With respect to an X-positioning mechanism, a horizontal arm 34 fixed to the upper end of the rotation support 30 is formed to have a substantially rectangular cross section. A pair of X-direction guide rails 94 are provided on a side of the arm 34 while an X-direction guide rail 96 is provided on the opposite side of the arm 34 along the lengthwise direction thereof. The pair of guide rails 94 are provided with a first slide block 38 such that it is slidable with being bridged between the pair of guide rails 94. Meanwhile, the guide rail 96 is provided with a second slide block 100 such that the block 100 is slidable along the guide rail 96. A joint plate 102 is bridged between the two blocks 38 and 100, thereby connecting the blocks with each other (see FIGS. 1 and 2).

The rotation support 30 which serves as the rotational center of the horizontal arm 34 is installed at a position which is apart from the end portion of the horizontal arm 34 by a distance equivalent to the length of the slide blocks 38 and 100. As a result of this, the rotation support 30 and a bridge plate 104 described below do not interfere with each other, even when the test head 12 is rotated in the θY-direction, for example, for about 120° during maintenance of the test head 12, as will be explained later.

A rack 106 is formed on one side of the lower surface of the horizontal arm 34, so as to extend in the lengthwise direction. A motor 108 for the X-direction is fixed to the first slide block 38, and a pinion gear 110 installed on the rotation axis of the motor 108 is engaged with the rack 106. In this manner, the slide blocks 38 and 100 are movable in the X-direction.

The horizontal arm 34 and the first slide block 38 are provided with lock means 112 for obtaining locking in the X-direction. Specifically, as shown in FIGS. 2, 14, and 15A to 15C, the lock means 112 substantially comprises a pair of lock plates 114A and 114B respectively provided at both ends of a side surface of the horizontal arm 34, and a lock pin 116 provided at the first slide block 38. The lock plates 114A and 114B are provided with a shock absorber 128 for absorbing an impact caused when the slide block 38 stops (see FIG. 3).

The lock plates 114A and 114B are respectively installed and fixed onto positions where the first slide block 38 should be locked after having finished its movement in the X-direction. Lock holes 118 of the plates 114A and 114B are tapered to form a conical shape. The top end of a lock pin 116 which is engaged with the holes 118 is arranged to form a conical convex shape so that the top end has a close contact with the tapered surface of each of the holes 118. The pin 116 is driven to move forward or backward by the air-cylinder 120 under control of the control section 68.

The lock plates 114A and 114B are respectively provided with, for example, optical sensors 122A and 122B for detecting arrivals of the first slide block 38 at predetermined positions. Shutter members 124A and 124B are respectively provided at both sides of the air cylinder 120. When these shutter members 124A and 124B enter into the optical sensors 122A and 122B thereby shielding optical passages, shut-off signals are supplied from these sensors and inputted into the control section 68. Upon receipt of the shut-off signals, the control section 68 drives the air-cylinder 120 thereby to push out the lock pin 116. As a result of this, positioning of the slide block in the X-direction and locking thereof at a stopping position can be achieved.

A long hole (not shown) is provided at the installation portion of the one of those lock plates 114A and 114B, whose stopping position must be changed, for example, the installation position of the lock plate. Therefore, the installation position of the lock plate 114B can be adjusted in the lengthwise direction of the long hole within a range of the length thereof.

The control section 68 is connected with a sensor 126 for releasing lock of the lock means 112 when the test head 12 is aligned on the main body 2, as will be described (see FIGS. 12A and 12B). When the sensor 126 detects access of the test head 12, the control section 68 operates so as to release the lock of a lock pin 116 in the X-direction.

The same lock means as the stopping position lock means 112 stated above are provided for other positioning mechanisms, e.g., a lock plate 90 of the θZ-positioning mechanism 32 (see FIG. 3) and a θY-positioning mechanism 40 which will be described later. Therefore, the stopping positions of these mechanisms are maintained when their movements in the respective axes stop.

Next, the θY-positioning mechanism 40 will be explained. The first slide block 38 is equipped with a motor 135 as a drive source for the θY-direction, as shown in FIGS. 1 to 3. The rotation axis of the motor 135 is fixed to a U-shaped outer frame 138 of a frame section 42 through a bearing 136 (see FIG. 3) with use of a number of threads 140, so that the rotation axis is rotatable for 180° in the θY-direction. A lock plate (not shown) forming a part of the θY-direction stopping position lock means is provided on the outer side surface of the outer frame 138, which faces the first slide block 38. Facing the lock plate in the θY-direction, an air cylinder 144 for the θY-direction having a lock pin 142 is fixed to the first slide block 38.

The bridge plate 104 extending in the horizontal direction is fixed to the center portion of the outer frame 138 through a joint bar 146. The plate 104 crosses over a horizontal arm 34 without interfering with the horizontal arm, but with a wiring bundle 16 being supported on the upper surface of the plate. A fastener 134 for retaining the wiring bundle 16 is provided on the bridge plate 104.

Figure 4:
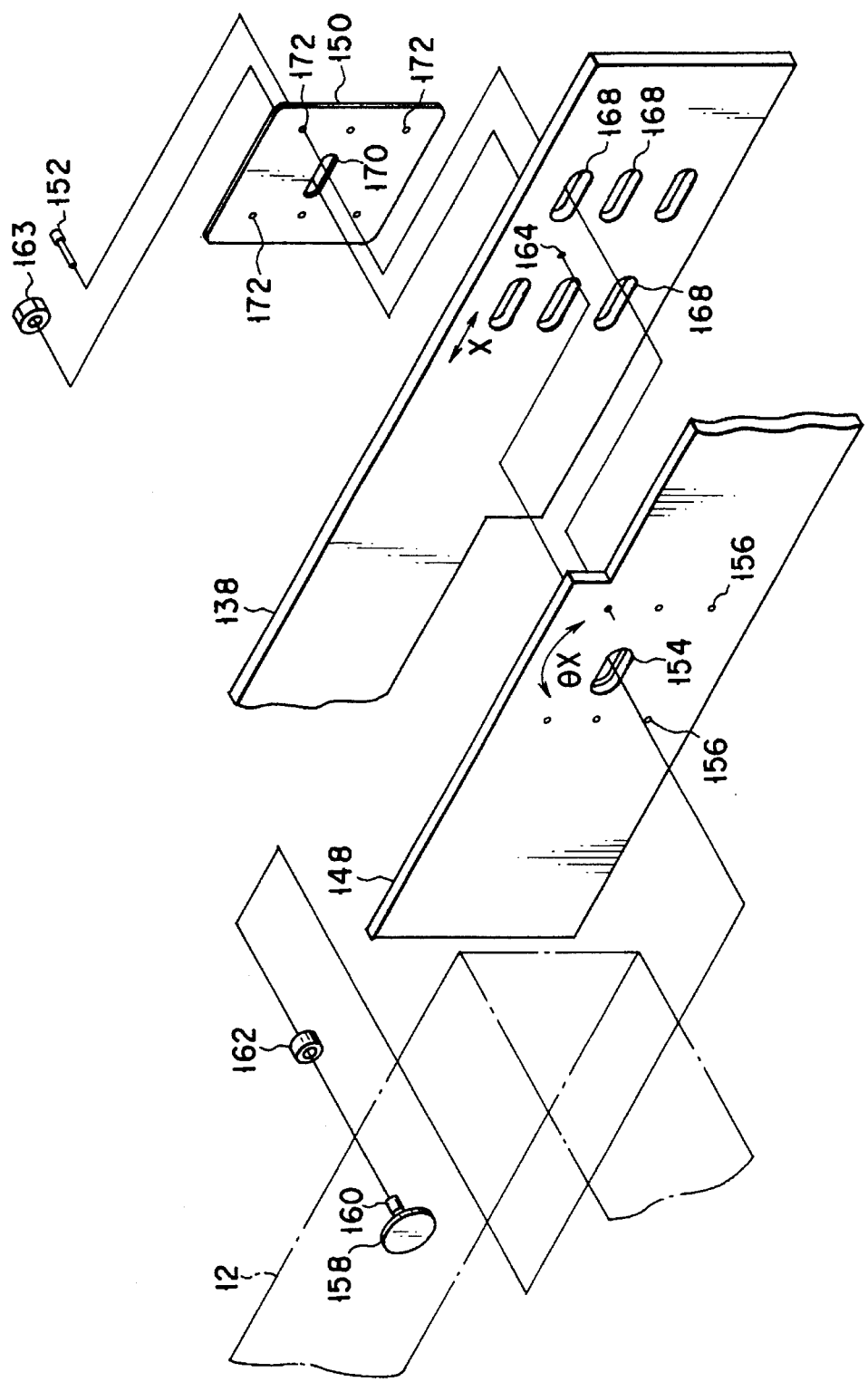
FIG. 4 is a exploded perspective view showing a state in which the test head is installed on a frame.

Next, the Y-positioning mechanism 44 and the θX-positioning mechanism 46 will be explained. The frame section 42 comprises a U-shaped outer frame 138 and two inner frames 148 installed on the top end of the frame 138. When the side surface of the test head 12 is fixed to both ends of the outer frame 138 by the inner frames 148, positioning is carried out in both the Y- and θX-directions (see FIG. 5). As is shown in FIG. 4, one of the inner frames 148, the outer frame 138, and a square washer 150 are layered on each other and are suitably positioned. Thereafter, these components are fastened by six threads 152.

A long hole 154 extending in the Y-direction and six thread holes arranged in the periphery of the hole are formed in the inner frame 148. An installation shaft 160 is provided so as to penetrate through the long hole 154, with a bearing 162 being inserted therebetween, and a circular flange 158 is provided at an end portion of the shaft 160. The shaft 160 is designed to be sufficiently long, and the top end of the shaft is threaded so as to be engaged with a tightening nut 163. The bearing 162 is designed to have a thickness equal to or less than that of the inner frame 148, and the bearing 162 is movable in the Y-direction, i.e., in the horizontal direction within the bearing 162.

A shaft through-hole 164 is formed in the outer frame 138 at a portion corresponding to the long hole 154, and long holes 168 extending in the Y-direction are also formed in the outer frame 138 at portions respectively corresponding to the six thread holes 156. As shown in FIG. 6, the length of the long holes 168 is designed to be long enough to carry out positioning in the Y-direction. The width L2 of the holes 168 is designed to be as several times large as the diameter of threads 152 which are inserted into these holes. Therefore, the inner and outer frames 138 and 148 can relatively rotated in the θX-direction within a range of angle α, e.g., 10° around the shaft through-hole 164 as the center of rotation.

A long hole 170 extending in the Y-direction is formed in the washer 150 at a portion thereof corresponding to the shaft through hole 164. In the periphery of the long hole 170, six thread holes 172 are formed at portions thereof respectively corresponding to the thread holes 156. The washer 150 is designed to be long enough to carry out positioning in the Y-direction. The washer has a width slightly greater than the diameter of the shaft 160, so that the shaft penetrates through the washer, with a substantial contact being maintained therebetween.

The shaft 160 is inserted into the long hole 154 of the inner frame 148 with the bearing 162 being engaged with the shaft 160. Then, the inner frame 148 is attached to a side wall of the test head 12, using threads (not shown) which are fastened to threaded holes formed on the side wall of the test head 12 for fixing the inner frame 148 onto the test head 12. Then, the outer frame 138 and the washer 150 are superposed on the inner frame 148, and are temporarily fastened thereto by the six threads 152. In this state, the relative positions of the outer frame 138 and the test head 12 are adjusted in the Y- and θX-directions. Further, the threads 152 and the tightening nut 163 are tightened, thereby fixing the outer frame 138 and the test head 12 with themselves being positioned in the Y- and θX-directions.

There may be a case in which the test head 12 must be rotated in the θX-direction when fine positioning is performed in the θX-direction. Since a bearing 162 is provided for the shaft 160 and this bearing can be rotated with ease, fine positioning in the θX-direction can be performed with ease.

As has been explained above, positioning of six axes can be achieved with respect to the test head 12. The above positioning mechanisms for six axes actually have rough accuracy, and therefore, merely achieve a function of rough positioning. Fine positioning is therefore necessary to attain alignment when the test head 12 is finally set on the main body 2.

Figure 11:
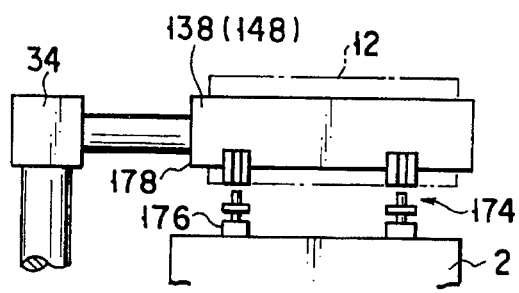
FIG. 11 is a schematic side view showing aligning means provided between the manipulator and the main body.
Figure 12A:
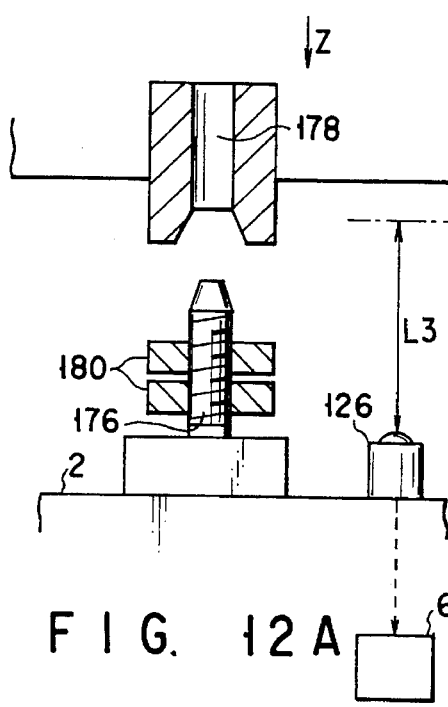
FIGS. 12A and 12B are views for explaining operation of the aligning means shown in FIG. 11.
Figure 12B:
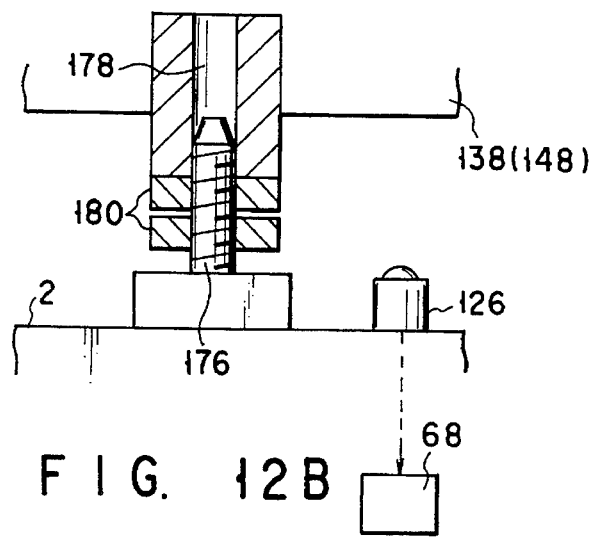

As shown in FIGS. 11, 12A, and 12B, aligning means 174 for finely adjusting positions by means of engagements are provided on the upper surface of the main body 2 and the lower surface of the frame section 42 corresponding to the upper surface, thereby to attain alignment. More specifically, the aligning means consists of a rod-like convex portion 176 formed on the upper surface of the main body 2 and a concave portion 178 formed on the lower surface of the frame section 42 which is brought into close contact with the convex portion 176, thereby forming an engagement therebetween. The aligning means 174 are provided at least at two positions. The convex portion 176 is threaded, and two height adjust nuts 180 are screwed thereon. The upper surface of the convex portion 176 receives the lower surface of the concave portion 178. Therefore, not only positioning of the test head 12 in the X- and Y-directions, but also fine positioning thereof in the θX- and θY-directions is attained.

The upper end portion of the convex portion 176 is formed to be conical, and the end portion of the concave portion 178 which receives the upper end portion of the convex portion 176 is opened to be also conical. Therefore, correction of the position of the test head 12 can be achieved by bringing these conical portions into contact with each other when the test head 12 gets close. When the position of the test head 12 is thus corrected, locking of the stopping position lock means of each positioning mechanism must be released before the convex portion 176 and the concave portion 178 are engaged with each other since the stopping position lock means of each positioning mechanism has already been operating to lock the stopping position. Therefore, an approach sensor 126 for detecting an approach of the test head 12 is provided on the upper surface of the main body 2. A detection signal of the sensor 126 is supplied to the control section 68. Upon receipt of the detection signal, the control section 68 outputs a lock release signal to at least one of stopping position lock means for the X-, θZ, and θY-directions, and brings the test head 12 into a floating condition by releasing the locking of the lock means. In this embodiment, the lock means for the X- and θZ-directions are released.

The sensor 126 should desirably be set so as to detect an approach of the test head 12 where the top end of the convex portion 176 slightly enters into the end of the concave portion 178 by a distance L3, and in this embodiment, the distance L3 is set to about 25 mm, for example. In addition, installation positions of the convex portion 176, the concave portion 178, and the sensor 126 may be changed to a reverse side of up and down sides. The sensor 126 should desirably located at a position where an operator does not approach during normal services, so that the sensor might not cause an erroneous operation in response to an approach of an operator.

Figure 13:
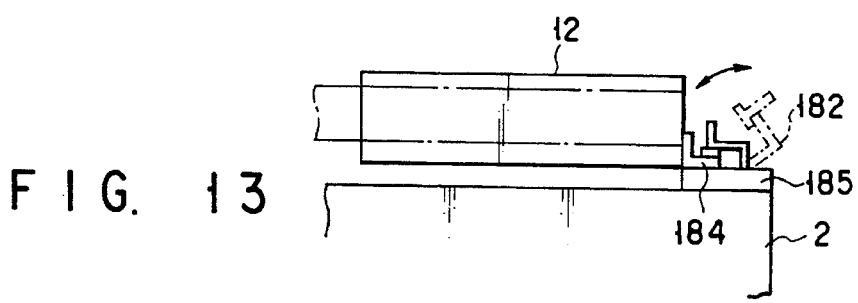
FIG. 13 is a side view showing a clump mechanism for fixing a test head provided at the main body.
Figure 14:
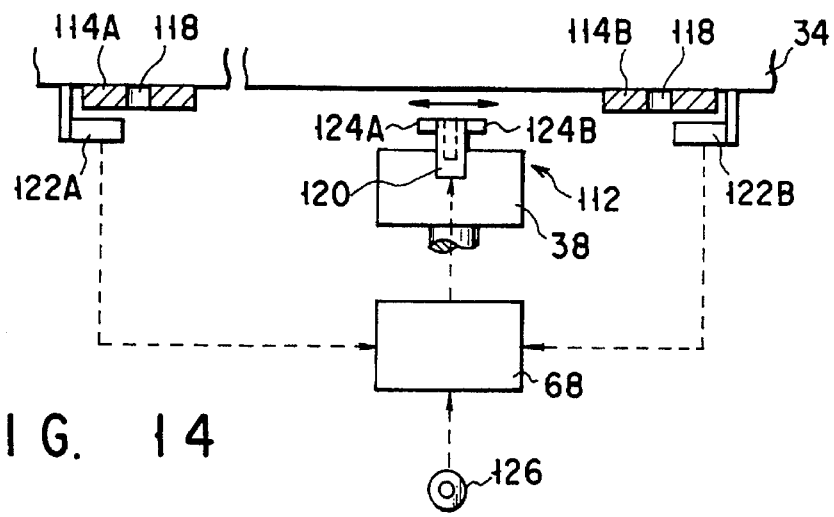
FIG. 14 is a view showing lock means for achieving lock in the X-direction.

As is shown in FIG. 13, in order to prevent the test head 12 from floating after final alignment thereof is once completed, a clamp mechanism 182 which is arranged so as to freely stand or lie is provided in an edge portion on the upper surface of main body 2 in the side opposite to the position of the convex portion 176. The clamp mechanism 182 is manually or automatically engaged with an L-shaped angle 184 provided at the edge portion of the test head 12. A installation base 185 of the clump mechanism retains a side portion of the test head 12.

As shown in FIG. 1, an operation handle 186 is bridged between ends of the two inner frames 148 of the frame section 42, so that an operator grasps the handle. The operation handle 186 is provided with a lock release button 188 for the θY-direction. In this embodiment, only locking in the θY-direction can be released. However, this embodiment may be arranged such that locking of several or all of the lock means may be manually released if necessary.

When a button 188 is operated, an air-cylinder 144 (see FIG. 3) is switched to a weak air pressure system among two air sources of strong and weak air pressure systems (not shown) connected to the air cylinder 144. As a result, an energizing force of the lock pin 142 is weakened so that the test head 12 can be manually rotated in the θY-direction. In addition, to prevent the test head 12 and the main body 2 from colliding with each other, the button 188 can be operated under condition that the horizontal arm 34 is completely rotated for 90° and positioned out of the range of the main body.

The manipulator 20 thus constructed has a Z-positioning mechanism 26 whose side portion is covered with a top cover 190 and a front cover 192, as shown in FIGS. 2 and 3. A plurality of bolt holes 194 (see FIG. 3) are formed in a side plate 52 standing on a manipulator base 22. The side plate 52 is fixed to the main body 2 by tightening the bolts, thereby preventing the manipulator 20 from overturning. In the figure, the reference numeral 196 denotes a monitor for displaying an operation state of the entire apparatus.

Next, operation of positioning the test head 12 with use of the manipulator 20 will be explained.

In this embodiment, positioning of the test head 12 in the Y- and θX-directions is carried out and fixed when the test head 12 is connected. The test head 12 is movable in the other four axial directions, i.e., the X-, Z-, θY-, and θZ-directions, so that positioning is carried out by corresponding positioning mechanisms.

At first, explanation will be made with reference to an example in which a test head 12 as a heavy load is installed and fixed onto a frame section 42 consisting of an outer frame 138 and inner frames 148.

As shown in FIG. 4, the inner frame 148, the outer frame 138, and the washer 150 are arranged on a side portion of the test head 12. Further, the shaft 160 penetrating through the bearing 162 is inserted into the long hole 154 of the inner frame 148, the shaft insertion hole 164 of the outer frame 138, and the long hole 170 of the washer 150, and these components are loosely tightened with the nut 163. In addition, the six threads 152 are inserted so as to penetrate through the thread holes 172, long holes 168 of the outer frame 138, and the thread holes 156 of the inner frame 148. Each of the threads 152 is loosely tightened onto the side portion of the test head, and are thus temporarily fastened.

The frame section 42 thus assembled is installed by the thread 140 (see FIG. 2) onto the θY-positioning mechanism 40 provided on a first slide block 38. The test head 12 is then moved onto the main body 2. In this situation, a Y-positioning mechanism 44, θX-positioning mechanism 46, and a θY-positioning mechanism 40 provided on the frame section 42 are used to perform positioning in the Y-, θX-, and θY-directions.

Specifically, the inner frame 148 and washer 150 can be positioned in the Y-direction within ranges of lengths of the respective long holes 154 and 170, with the shaft 160 being located as the center of the positioning. The outer frame 140 can be positioned within an angle α in the θX-direction with the shaft 160 located as the center, e.g., within a range of 10° at most. The θY-positioning mechanism 40 can be positioned in the θY-direction by releasing the lock pin 142.

The position of the frame section 42 in the θY-direction can be finely adjusted by engaging a concave portion 178 of aligning means 174 provided on the lower surface of the frame section 42, with a convex portion 176 provided on the upper surface of the main body 2. The position of the test head 12 in the θX- and θY-directions can be changed by changing the heights of the height adjusting nut 180 screwed on the convex portion 176 and the clump mechanism installation base 185. After positioning is thus finished in the above three axial directions, the nut 163 and each of the threads 152 are rigidly tightened thereby to fasten the frame section 42 and the test head 12.

Next, positioning in the X-direction along a horizontal arm 34 will be explained with reference to FIG. 14 and FIGS. 15A to 15C. At first, a motor 108 of the X-positioning mechanism 36 is driven, and first and second slide blocks 38 and 100 cantilevering the test head 12 are moved so as to run over the horizontal arm 34 along the guide rails 94 and 96. When the first slide block 38 approaches to one lock plate of the lock means provided on both ends of the horizontal arm 34, e.g., a plate 114A, a shutter member 124A provided on the lock plate enters into an optical sensor 122A and an approach of the block 38 is detected (see FIG. 15A). Then, the control section 68 drives an air-cylinder 120 so that the lock pin 116 protrudes and is engaged with a hole 118 of the plate 114A (see FIG. 15B).

As a result of this, the first slide block 38 is locked at a predetermined position of the horizontal arm 34. In this case, since the top end of the lock pin 116 is shaped to be conical, even a slight positional offset if any is corrected and locking is achieved. This operation is performed with respect to another lock plate 114B, so that the first and second slide blocks 38 and 100 are stopped and engaged on both the substantial ends of the horizontal arm 34.

when a movement in this X-direction is performed, a wiring bundle 16 extending from the test head 12 is supported and fixed on a bridge plate 104 by a fastener 134, and therefore can be moved without interfering with the horizontal arm 34.

Next, positioning in the Z-direction along a fixed support 24 will be explained mainly with reference to FIGS. 7 to 10. Firstly, a motor 62 of the Z-positioning mechanism 26 is driven thereby rotating a ball thread shaft 56 supporting a slide frame 50, so that the slide frame 50 is elevated up or down. For example, in case where the slide frame 50 is moved down, when the shaft 56 is rotated, a sleeve 70 engaged with the shaft 56 falls down, and the slide frame 50 moves down along the Z-direction guide rail 48 together with the sleeve 70 due to self-weight, the weight of the test head 12, and the likes. Accordingly, the lower end of the fall stopper 72 provided on the bottom plate 50A of the slide frame reaches a horizontal frame 54, as shown in FIG. 8A, and the slide frame 50 stops falling, thereby defining the lower end position of the test head 12.

Even when the frame 50 stops falling, the motor 62 keeps rotating so that only the sleeve 70 which is inserted through the bottom 50A further falls down. The fall of this sleeve 70 is detected by the approach sensor 80 provided on the sleeve rotation stopper 76, and the control section 68 supplies a command to the motor 62 thereby stopping the motor. As has been explained above, since the sleeve 70 is inserted into the frame bottom plate 50A, an unnecessary load is not applied to the slide frame 50 by the motor 62. A projecting length by which the stopper 72 protrudes in the Z-direction can be changed, and the position of the test head 12 in the Z-direction can be changed by changing the projecting length.

In order to elevate up the test head 12, the slide frame 50 is elevated up by rotating the motor 62 in the direction opposite to the above-mentioned direction. Specifically, when the motor 62 is rotated in the reversal direction, only the sleeve 70 is firstly elevated up as shown in FIG. 8B. When the flange 70A is brought into contact with the bottom plate 50A, as shown in FIG. 8A, the slide frame 50 starts elevating up and is elevated up to a predetermined position.

Since a load of the test head 12 which is applied to the slide frame 50 reaches about 300 kg at most, there is a possibility that the slide frame 50 suddenly falls down due to the load of the head 12 when power supply to the motor 62 stops due to some reasons such as a power breakdown or the like during elevation of the frame. However, in this embodiment, the Z-direction motor 62 and the shaft 56 are respectively provided with electro-magnetic brakes 82 and 84 as brake means, and for example, the rotation shaft of the motor and the shaft 56 are retained at positions where they stop when the power breakdown occurs. Therefore, a fall of the slide frame 50, i.e., the test head 12 can be prevented.

In the next, positioning in the θZ-direction is performed by rotating the horizontal arm 34, for example, for 90° with the rotation center 01 of the rotation support 30 being located as the center. Therefore, the air-cylinder 88 of the θZ-positioning mechanism 32 is driven thereby to rotate the rotation support 30 so that the test head 12 is rotated for 90° around the rotation support 30 (see FIG. 16C).

With respect to the positioning in the θY-direction, a motor 135 of the θY-positioning mechanism 40 provided on the first slide block 38 is driven. Then, the frame section 42 is rotated together with the test head 12 for a predetermined angle in the θY-direction, e.g., 180°, thereby performing positioning in the Y-direction (see FIG. 16C). A θY-lock pin 142 functions to lock the stopping position of the test head 12.

As has been explained above, movements and positioning of the test head 12 in the respective axial directions are carried out by positioning mechanisms for six axes. In addition, positioning mechanisms rendered movable are programmed such that two or more positioning mechanisms might not be simultaneously operated, in order to prevent erroneous operations.

Next, a case in which the test head 12 is brought into contact with the upper surface of the main body 2 will be explained mainly with reference to FIGS. 11, 12A, and 12B. The test head 12 is maintained to be substantially horizontal from a position above the main body 2 and is driven therefrom so as to be gradually moved down. In this state, positioning of the test head 12 in the X-, θY-, and θZ-directions is rough to some extent.

Figure 15A:
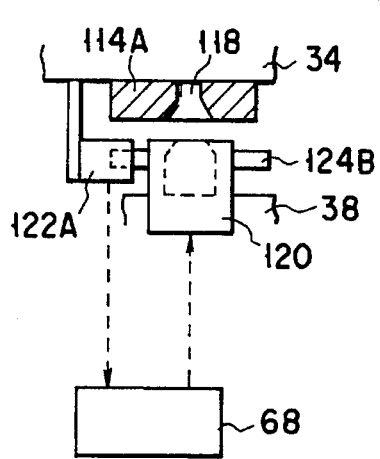
FIGS. 15A to 15C are views for explaining operation of the lock means shown in FIG. 14.
Figure 15B:
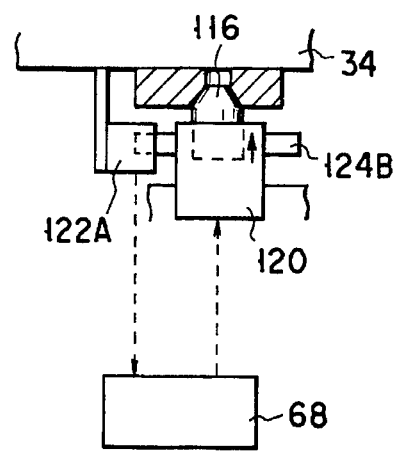
Figure 15C:
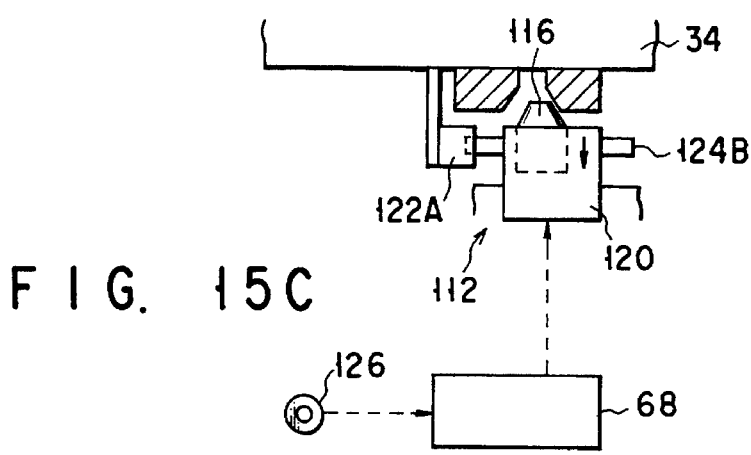

When the test head 12 is moved down and the test head 12 and the main body 2 approach to each other so that the top end of the convex portion 176 on the upper surface of the main body 2 enters into the end opening portion of the concave portion 178 on the lower surface of the test head, a Z-direction approach sensor 126 detects the approach of the test head 12. In this manner, the control section 68 supplies a lock release signal to all or a part of the portions where the lock means are operating, e.g., to the X-direction lock means 112 thereby to release the locking, as shown in FIG. 15C. In this case, the lock pin 116 is not moved back, but an air pressure of the air cylinder 120 for projecting the lock pin 116 is switched to a weak pressure, so that a slight repulsive force is enough to sink the lock pin 116. A release of the locking is common to the other lock means.

With the locking being released, the test head 12 is further elevated down, and then, the convex portion 176 and the concave portion 178 are closely engaged with each other. In this state, positional offsets of the test head 12 in the X- and θZ-directions are corrected, and simultaneously, the position of the head in the θY-direction is determined due to the function of the nut 180 provided at the convex portion 176. Therefore, a contact ring of the test head 12 and a probe card interface 10 of the main body 2 (see FIGS. 18 and 19) are aligned with a high accuracy. In order to prevent the test head 12 from floating up, the clump mechanism 182 is used to manually or automatically fix a end portion of the head 12, as shown in FIG. 13.

Figure 16A:
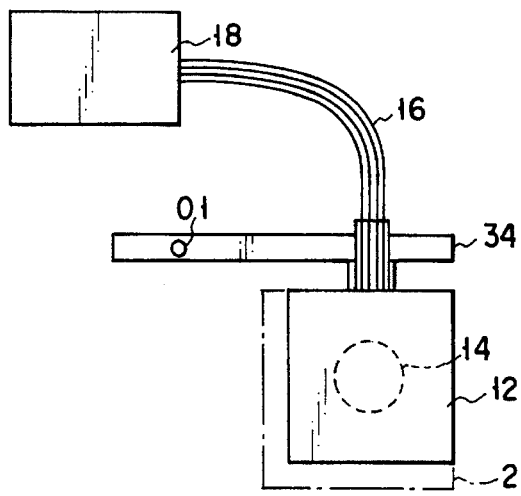
FIGS. 16A to 16D are views for explaining movements of the test head during maintenance.
Figure 16B:
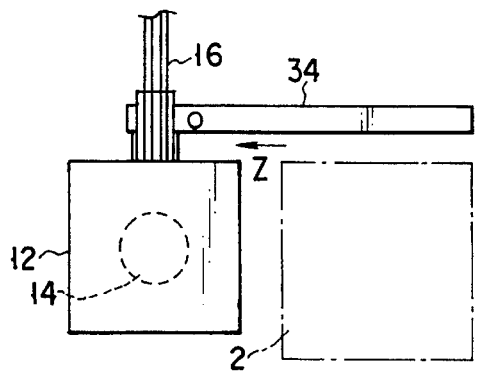

To carry out maintenance services for the test head 12 and the probe card, the X-positioning mechanism is driven to move the test head 12 along the horizontal arm 34, as shown in FIG. 16B, from a position where the test head 12 is positioned above the main body 2 as shown in FIG. 16A, and the test head 12 is thus positioned to an opposite end over the rotation center 01.

Figure 16C:
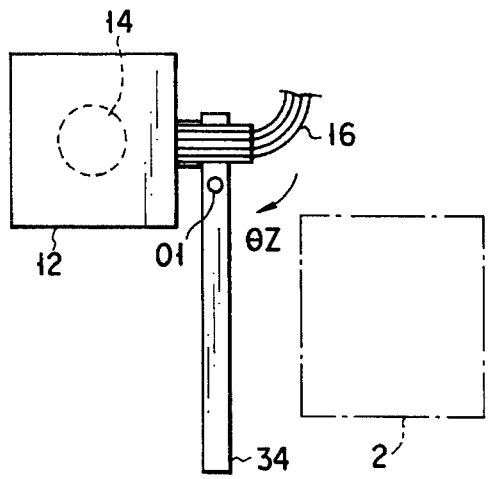
Figure 16D:
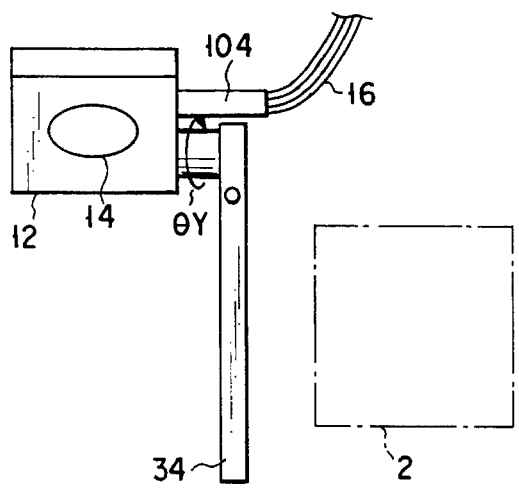

Next, as shown in FIG. 16C, the horizontal arm 34 is rotated for 90° around the rotation center 01. Further, as shown in FIG. 16D, the θY-positioning mechanism is driven thereby to reverse the test head 12, for example, for about 120° and to orient the contact ring 14 in a substantial upward direction, so that maintenance services can be performed with ease. In this case, a wiring bundle 16 extending from the test head 12 is positioned outside the end portion of the horizontal arm 34, so that the wiring bundle is prevented from interfering with the horizontal arm.

Since the test head 12 is thus moved toward the side of the rotation center 01 and the horizontal arm is rotated for 90°, the length of the wiring bundle 16 to a tester 18 can be shortened by about 1.5 m in comparison with the case where the horizontal arm is rotated for 90° without moving the test head 12 toward the side of the rotation center 01. Therefore, the delay time of a test signal of high frequency can be shortened, and simultaneously, a test signal of high frequency can be used, so that the test efficiency is improved. In addition, a swing of the wiring bundle 16 which swings as the horizontal arm 34 rotates is reduced, so that accidents such as a breaking of wire and the likes can be reduced.

The θY-positioning mechanism is driven when the test head 12 is reversed by 120°. The test head 12 may otherwise be manually rotated by 120° in such a manner in which an operator operates a θY-release button 188 provided on the operation handle 186 to release the θY-lock means as stated above without using the θY-positioning mechanism.

Thus, positioning of the test head 12 can be manually or automatically with respect to six axes, the operational ability of the entire prober can be greatly improved. In addition, since the test head 12 can be moved down and brought into contact with the main body 2 with itself being maintained in a horizontal state, in-plane uniformity of the contact pressure of the contact ring can be improved in comparison with a conventional device in which the test head is rotated.

Next, a fall preventing mechanism 202 will be explained with reference to FIG. 17.

As has been explained above, when power supply to the drive motor 62 for the Z-direction stops, for example, when an power supply interruption occurs, the electro-magnetic brakes 82 and 84 operate to stop rotation of the ball thread shaft 56, so that a fall of the test head 12 is prevented. However, when pulleys 60 and 64 are damaged or a belt 66 breaks while power is normally supplied to the drive motor 62, the electro-magnetic brake 82 does not operate and therefore, a risk occurs that the test head 12 may fall. A fall preventing mechanism 202 is provided supposing such a risk.

The fall preventing mechanism 202 comprises a nut 203 and a shaft 204 coupled with each other to form a ball thread. The nut 203 is fixed to a bottom plate 50A of a slide frame 50, and the shaft 204 extends vertically and is engaged with the nut 203. A brake shoe 205 made of a metal is fixed to a lower end portion of the shaft 204, and a brake base 206 made of a metal facing the lower surface of the brake shoe is fixed to the horizontal frame 54. The lower surface of the brake shoe 205 is formed like a truncated cone, while a brake seat 210 is formed in the brake base 206 such that the brake seat consists of a counter bore formed to have a complementary shape which complies with the lower surface of the shoe 205.

The lower surface of the brake shoe 205 is brought into contact with a metallic ball 207 which serves as a thrust bearing for the shaft 204. The ball 207 is pushed against the brake shoe 205 by a spring 208, and therefore, a predetermined small gap is formed between the lower surface of the brake shoe 205 and the surface of the brake seat 210. The size of this gap is determined on the basis of a condition that a heavy load to be moved does not collide with any other portions or receives any impact therefrom because of a slight fall allowed by the gap. In this embodiment, the gap is set to 1.0 to 1.5 mm, taking into consideration that the object and peripheral devices to be moved are very sensitive and precise components, i.e., a test head 12 and a probe body 2.

The ball 207 is arranged such that the center of the lower surface of the brake shoe 205 is aligned with the ball and the brake shoe is supported at the center as the supporting point. The spring 208 is contained in a cylindrical bore 209 formed in the brake base 206 and having a greater diameter than the ball 207. The spring 208 has a spring force of, for example, 10 kgf/cm$^2$ (about 100N). When a load equal to or more than the spring force is applied to the spring 208, the ball 208 moves backward into the bore 209 and the lower surface of the brake shoe 205 is brought into contact with the surface of the brake seat 210.

In place of the ball 207, it is possible to use a pin having a contact with the center of the lower surface of the brake shoe 205 or a well-known thrust ball bearing having a contact with this lower surface, as a thrust bearing for the shaft 204. Further, a thrust bearing for the shaft 204 is not limited to those which have a contact with the lower surface of the brake shoe 205, but may be a thrust ball bearing, for example, which is energized by a spring and has a contact with a lower surface of a flange provided so as to extend from a middle portion of the shaft 204.

In a normal operation, when the drive shaft 56 is rotated by the Z-direction drive motor 62, the shaft 204 of the fall prevent mechanism 202 rotates within a nut 203 and moves in the axial direction. In this state, a load of the test head 12 is substantially supported by the shaft 56 connected with the drive motor 62, and the lower surface of the shaft 204 always has a contact with a ball 207, thereby maintaining its condition supported at one point. In order to maintain a contact between the shaft 204 and the ball 207 by only a slight pressure applied by the self-weight of the shaft 204 and the spring force of a spring 208, the thread mechanism constituted by the nut 203 and the shaft 204 must attain an excellent conversion efficiency with which a rotation movement is converted into a linear movement. From this point of view, the present invention adopts a thread mechanism, such as a ball thread, which uses a principle of bearing using a number of rotation elements such as balls, rollers, and the likes.

When the belt 66 breaks due to fatigue while power supply to the motor 62 is normally maintained, the connection between the shaft 56 and the drive motor 62 is shut out, and a load of the test head 12 of about 300 kg is abruptly applied not only to the shaft 56 but also to the shaft 204. Therefore, the test head 12, i.e., the slide frame 50 abruptly starts falling. However, since rotation of the shaft 204 cannot catch up with the falling speed, a high thrust load abruptly effects on the shaft 204.

This thrust load exceeds the bias force of the spring 208 and pushes the ball 207 into the bore 209 of the brake base 206 by means of the shaft 204. Therefore, the brake shoe 205 sinks into and pressed against the brake seat 210 of the brake base 206. In this state, the thrust load causes high friction between the brake shoe 205 and the inner surface of the brake seat 210. As a result of this, the friction prevents the shaft 204 from rotating, and therefore, the test head 12 is prevented from colliding with the main body 2.

In addition, the present invention is applicable to a prober for an LCD substrate. The present invention is also applicable to various transfer apparatus which are used to move a heavy load up and down.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A transfer apparatus for moving a heavy load up and down, comprising:

a support for supporting the heavy load;

an elevator for moving the support up and down, with the heavy load being supported by said support;

a base upon which the elevator is mounted;

a nut of a ball thread, attached to the support, said ball thread having a center axis oriented in a substantially vertical direction;

a shaft of the ball thread, said shaft engaged with the nut;

a brake shoe provided at a lower end portion of the shaft;

a brake seat provided on the base so as to face a lower surface of the brake shoe;

a thrust bearing for substantially rotatably supporting the shaft; and a spring for supplying the thrust bearing with a bias force against the shaft, such that a small gap is formed between the brake shoe and the brake seat, wherein when a thrust load exceeding the bias force of the spring is applied to the shaft by the heavy load due to a breakdown of the elevator, the shaft moves down together with the support by a distance corresponding to the small gap and the brake shoe and the brake seat are therefore brought into contact with each other, thereby preventing rotation of the shaft relative to the nut, so that the support is prevented from further downward movement.

2. The transfer apparatus according to claim 1, wherein the thrust bearing is in contact with the lower surface of the brake shoe.

3. The transfer apparatus according to claim 2, wherein the thrust bearing is in point-contact with a center of the lower surface of the brake shoe.

4. The transfer apparatus according to claim 3, wherein the thrust bearing comprises a ball.

5. The transfer apparatus according to claim 3, wherein a hole which the thrust bearing can move into is formed at a center of the brake seat and the spring is arranged in the hole.

6. The transfer apparatus according to claim 1, wherein the lower surface of the brake shoe has a shape of a truncated cone and a surface of the brake seat has a shape complementary to the lower surface of the brake shoe.

7. A prober for testing electric characteristics of a test object, comprising:

a work table for mounting the test object;

a plurality of probe needles provided above the work table;

an interface section electrically connected to the probe needles;

a casing for supporting the interface section;

a test head which can be electrically connected to the interface section and is detachable therefrom;

a support for supporting the test head when the test head is moved relative to the interface section;

an elevator for moving the support up and down, with the test head being supported by said support;

a base upon which the elevator is mounted;

a nut of a ball thread, attached to the support, said ball thread having a center axis oriented in a substantially vertical direction;

a shaft of the ball thread, said shaft engaged with the nut;

a brake shoe provided at a lower end portion of the shaft;

a brake seat provided on the base so as to face a lower surface of the brake shoe;

a thrust bearing for substantially rotatably supporting the shaft; and a spring for supplying the thrust bearing with a bias force against the shaft, such that a small gap is formed between the brake shoe and the brake seat, wherein when a thrust load exceeding the bias force of the spring is applied to the shaft by the test head due to a breakdown of the elevator, the shaft moves down together with the support by a distance corresponding to the small gap and the brake shoe and the brake seat are therefore brought into contact with each other, thereby preventing rotation of the shaft relative to the nut, so that the support is prevented from further downward movement.

8. The prober according to claim 7, wherein the test head is moved up and down by the elevator, while being kept substantially parallel to the interface section, when the test head is attached to or detached from the interface section.

9. The prober according to claim 8, further comprising alignment means for aligning the test head with the interface section, said alignment means comprising paired components provided between the support and the casing.

10. The prober according to claim 8, wherein the thrust bearing is in point-contact with a center of the lower surface of the brake shoe.

11. The prober according to claim 9, wherein the thrust bearing comprises a ball.

12. The prober according to claim 9, wherein a hole which the thrust bearing can move into is formed at a center of the brake seat and the spring is arranged in the hole.

13. The prober according to claim 7, wherein the elevator comprises a motor and is provided with an electro-magnetic brake which is operated so as to prevent the support from moving down when power supply to the motor is shut off.

14. The prober according to claim 7, further comprising a fall stopper defining a lowermost position of the support with respect to said base.

15. The prober according to claim 14, wherein the elevator comprises a motor, a second shaft of a second ball thread which is rotatably supported on the base and is driven by the motor, and a second nut of the second ball thread which is provided on the support and is engaged with the second shaft.

16. The prober according to claim 15, wherein the second nut comprises a flange for lifting up the support and is arranged on the support such that the second nut is movable in its axial direction but is not rotatable on its axis.

17. The prober according to claim 16, further comprising means for detecting a fall of the second nut relative to the support and for stopping the motor after the fall stopper prevents the support from moving down.

18. The prober according to claim 7, wherein the support comprises X-, Y-, θX-, θY-, and θZ-positioning mechanisms for respectively positioning the test head in X-, Y-, θX-, θY-, and θZ-directions, said X- and Y-directions being perpendicular to each other in a horizontal plane and said θX-, θY-, and θZ-directions being rotational directions whose rotational axes are respectively the X-direction, the Y-direction, and a Z-direction vertical to the horizontal plane.

19. The prober according to claim 7, wherein the thrust bearing is in contact with the lower surface of the brake shoe.

20. The prober according to claim 7, wherein the lower surface of the brake shoe has a shape of a truncated cone, and a surface of the brake seat has a shape complementary to the lower surface of the brake shoe.

* * * * *